(12) United States Patent
Hshieh et al.

(10) Patent No.: US 6,312,993 B1
(45) Date of Patent: Nov. 6, 2001

(54) HIGH SPEED TRENCH DMOS

(75) Inventors: Fwu-Iuan Hshieh, Saratoga; Koon Chong So, Fremont, both of CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/515,749

(22) Filed: Feb. 29, 2000

(51) Int. Cl.⁷ .................................................. H01L 21/336
(52) U.S. Cl. .......................... 438/270; 438/301; 438/308; 257/327; 257/338; 257/335
(58) Field of Search .................................. 438/232, 301, 438/308, 270; 257/327, 328, 335, 342

(56) References Cited

U.S. PATENT DOCUMENTS 6,025,237 * 2/2000 Choi ...................................... 438/301
6,114,065 * 11/2000 Kinzer ................................... 257/327

OTHER PUBLICATIONS

Satoshi Matsumoto, Hideo Yoshino, Hiromu Ishii, Terukazu Ohno, A 70–V, 90–mΩ. mm², High–Speed Double–Layer Gate UMOSFET Realized by Selective CVD Tungsten, Proceedings of the 6th International Symposium on Power Semiconductor Devices & IC's, Switzerland, May 31—Jun. 2, 1994, pp. 365–369.

* cited by examiner

*Primary Examiner*—David Nelms
*Assistant Examiner*—Renee' R. Berry
(74) *Attorney, Agent, or Firm*—Mayer Fortkort & Williams, PC; Stuart H. Mayer, Esq.; Karin L. Williams, Esq.

(57) ABSTRACT

A method for making trench DMOS is provided that utilizes polycide and refractory techniques to make trench DMOS which exhibit low gate resistance, low gate capacitance, reduced distributed RC gate propagation delay, and improved switching speeds for high frequency applications.

36 Claims, 7 Drawing Sheets

HIGH SPEED TRENCH DMOS

FIELD OF THE INVENTION

The present invention relates generally to MOSFET transistors and more generally to DMOS transistors having a trench structure.

BACKGROUND OF THE INVENTION

DMOS (Double diffused MOS) transistors are a type of MOSFET (Metal On Semiconductor Field Effect Transistor) that use diffusion to form the transistor regions. DMOS transistors are typically employed as power transistors to provide high voltage circuits for power integrated circuit applications. DMOS transistors provide higher current per unit area when low forward voltage drops are required.

A typical discrete DMOS circuit includes two or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors it behaves as if it were a single large transistor. For a discrete DMOS circuit it is desirable to maximize the conductivity per unit area when the transistor matrix is turned on by the gate.

One particular type of DMOS transistor is a so-called trench DMOS transistor in which the channel is formed vertically and the gate is formed in a trench extending between the source and drain. The trench, which is lined with a thin oxide layer and filled with polysilicon, allows less constricted current flow and thereby provides lower values of specific on-resistance. Examples of trench DMOS transistors are disclosed in U.S. Pat. Nos. 5,072,266, 5,541, 425, and 5,866,931.

One problem frequently experienced with trench DMOS transistors is known as punch-through. Punch-through, which arises when the transistor channel is depleted, typically takes the form of a non-destructive leakage current prior to avalanche breakdown. It has been found that punch-through is particularly deleterious at higher transistor cell densities, notably at densities greater than about $18M/in^3$. While punch-through can have many causes, one significant cause of punch-through occurs during the formation of the trench gate. In particular, after the trench has been etched, a sacrificial oxidation step is performed to smooth the trench sidewalls, which is then followed by deposition of the thin oxide layer. During the sacrificial oxidation and oxide deposition steps, dopant material leaches out of the adjacent channel (the so-called p-body) because dopant material (typically boron) segregates from the silicon into the oxide during the sacrificial oxidation step, which is performed at high temperatures. This problem is exacerbated at higher cell densities, because the relative width of the channel decreases with respect to the surface area encompassed by the trench.

Punch-through is also aggravated when polysilicon is deposited to fill the trench because the dopant (typically phosphorous) employed in the polysilicon can penetrate through the gate into the p-body, which effectively reduces the concentration of carriers in the channel. This problem becomes more severe as the thickness of the gate oxide layer lining the trench is reduced.

U.S. Pat. No. 5,072,266 discloses a conventional sequence of processing steps that are employed to fabricate a trench DMOS transistor. In this process, the p-body channel and the source regions are formed before the trench. As previously mentioned, however, during the formation of the trench, dopant materials can leach out of the p-body, increasing punch-through. As a result, the depth of the trench and the p-body must be increased to compensate for the increase in punch-through. Moreover, the source regions may also be adversely effected during the formation of the trench because of silicon defects produced in the source regions during the oxidation steps used in forming the trench gate.

U.S. Pat. No. 5,468,982 attempts to reduce punch-through by forming the p-body after the trench gate has been etched and filled. This approach is not entirely satisfactory, however, since the formation of the p-body requires a diffusion step that involves high temperatures (typically 1100–1150° C.). These high temperatures allow the dopant material in the polysilicon that fills the trench to penetrate through the gate oxide at a greater rate, thus contributing to an increase in punch-through.

Another problem with existing trench DMOS is switching speed. There is a significant emphasis in the industry toward producing discrete DMOS circuits with higher cell densities. However, as cell density is increased, trench widths must be shrunk in order to achieve design requirements, and the narrower trench widths result in higher gate resistance. Consequently, switching speed becomes an important consideration.

Polycide, such as $WSi_2$ and $TiSi_2$, and refractory metals and alloys such as W and TiW, have been used in advanced logic processes to increase the switching speeds of devices and IC circuits. However, it is still not common to use polycide or refractory metal techniques in trench DMOS, due in part to the fact that the higher switching speeds which are theoretically achievable with these materials has not been realized. The reason for this can be understood by considering a typical prior art trench DMOS equipped with a double-layer gate. The gate is produced by selective CVD tungsten. In trench DMOS of this type, the P-body and source are formed before the trench gate is formed. Transistors of this type have at least two drawbacks. Firstly, silicon defects are easily formed in the source region during subsequent oxidation processes, such as sacrificial and gate oxidations. Since the source region is typically heavily doped with arsenic, this results in poor gate oxide integrity in this region. Secondly, transistors of this type typically have a deeper source junction depth due to the subsequent oxidation processes, which requires a deeper P-body and trench in order to prevent punch-through. Consequently, the device has higher parasitic capacitance, which reduces the benefit gained from the tungsten/poly gate.

There thus remains a need in the art for a trench DMOS, and a method for making the same, in which the trench DMOS has a low gate resistance and low capacitance, thereby reducing the distributed RC gate propagation delay and improving switching speed for high frequency applications. There is also a need in the art for a method for making a trench DMOS that reduces or eliminates punch-through. These and other needs are met by the present invention, as hereinafter disclosed.

SUMMARY OF THE INVENTION

The present invention relates to methods for creating trench DMOS, and to the trench DMOS so made. In accordance with the invention, polycide and refractory techniques are used to make trench DMOS which exhibit low gate resistance, low gate capacitance, reduced distributed RC gate propagation delay, reduced punch-through, and improved switching speeds for high frequency applications.

In one aspect, the present invention relates to a method for making trench DMOS, and to the trench DMOS so made. In accordance with the method, the source, which may be an n+ source, is formed after gate oxidation. This allows the junction depth to be controlled within a very shallow range (e.g., 0.2 to 0.5 µm), which reduces parasitic capacitance by allowing the use of a shallower Pbody and shallower trench depth without increasing the risk of drain/source punch-through. The formation of the source after gate oxidation is also advantageous in that it provides for improved gate oxide integrity, since it eliminates silicon defects in the source region (which is typically heavily doped with arsenic) that would otherwise result from the oxidation processes. Moreover, this methodology results in less stress or void formation between the polysilicon and polycide or refractory metal, since the device is not exposed to any high temperature processes after CVD polycide or refractory metal deposition.

In another aspect, the present invention relates to a trench DMOS having a gate construction having at least three layers, and to a method for making such a trench DMOS. In the gate construction, the first layer, which is typically disposed on the gate oxide layer, comprises undoped polysilicon, while the second layer comprises doped polysilicon and the third layer comprises a material selected from the group consisting of polycides and refractory metals. The first layer serves as a buffer to block phosphorous penetration through the gate oxide during BPSG flow, thereby preventing drain/source punch-through.

In still another aspect, the present invention relates to a method for making a trench DMOS, and to trench DMOS so made, in which the dopant material is prevented from leaching out of the P-body during trench formation. In accordance with the method, trench formation is accomplished by the use of a patterned trench mask in conjunction with an etching process. Before the mask is removed, the side walls of the trench may be smoothed with a sacrificial oxide layer. Since trench formation is completed prior to removal of the mask, and since the mask serves as a cap or barrier to the dopant material, leaching of the dopant material from the P-body is substantially eliminated, and punch-through is consequently reduced.

In yet another aspect, the present invention relates to a trench DMOS, and a method for making the same, in which a portion of the gate layer is disposed above the source area so that it is further from the drain than the source area. The resulting structure has a lower gate resistance, especially in a shallow trench device, and higher switching speeds.

DETAILED DESCRIPTION

The present invention provides methods for creating trench DMOS which utilize polycide and refractory techniques. The trench DMOS made in accordance with these methods exhibit low gate resistance, low gate capacitance, reduced distributed RC gate propagation delay, reduced punch-through, and improved switching speeds for high frequency applications.

Figure 1:
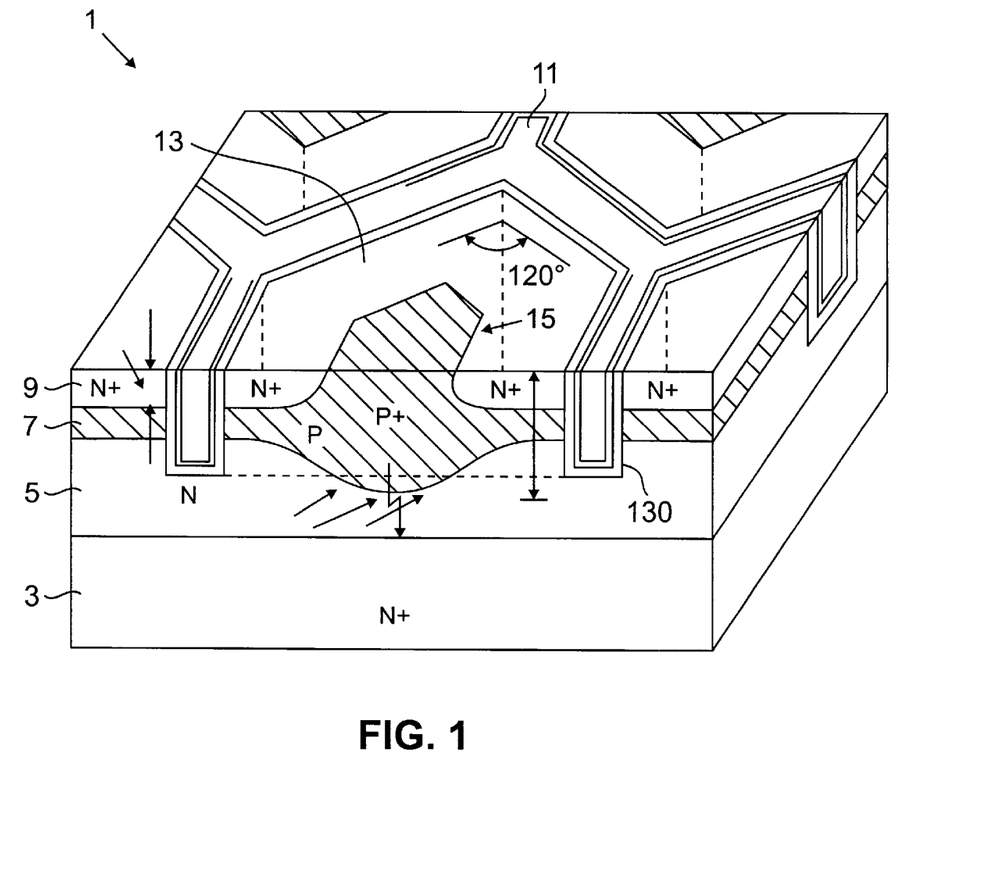
FIG. 1 shows a schematic cross-sectional view of one embodiment of a trench DMOS transistor constructed in accordance with the present invention.

FIG. 1 illustrates a trench DMOS structure 1 which is made in accordance with the present invention. The structure includes an n+ substrate 3 on which is grown a lightly n-doped epitaxial layer 5. Within the doped epitaxial layer, a body region 7 of opposite conductivity is provided. A doped epitaxial layer 9 that overlies most of the body region serves as the source. A hexagonally shaped trench 11 is provided in the epitaxial layer, which is open at the upper surface of the structure. The trench associated with each transistor cell defines a cell region 13 that is also hexagonally shaped in horizontal cross-section. Within the cell region, the body region rises to the upper surface of the structure and forms an exposed pattern 15 in a horizontal cross section at the top surface of the cell region.

The MOSFET shown in FIG. 1 has its gate positioned in a vertically oriented rectangular trench. This structure is often called a trench vertical DMOSFET. It is "vertical" because the drain contact appears on the back or underside of the substrate and because the channel flow of current from source to drain is approximately vertical. This set-up minimizes the higher resistance associated with bent or curved current paths or with parasitic field effect constructions. The device is also doubly diffused (denoted by the prefix "D") because the source region is diffused into the epitaxial material on top of a portion of the earlier-diffused body region of opposite conductivity type. This structure uses the trench side wall area for current control by the gate and has a substantially vertical current flow associated with it. As previously mentioned, this device is particularly appropriate for use as a power switching transistor where the current carried through a given transverse silicon area is to be maximized.

It should be noted that the transistor cell 13 need not have a hexagonal shape for basic transistor operation, but more generally may have any polygonal shape. However, a regular rectangular shape and a regular hexagonal shape are the most convenient for layout purposes. Alternatively, rather than having a closed cell geometry as depicted in the figures, the transistor cell may have an open or stripe geometry. Examples of various transistor cell geometries are shown in the previously mentioned references. Moreover, it should also be noted that in FIG. 1 and the figures that follow, only the substrate, its associated doped regions and the trench are shown. Other layers such as overlying insulating layers, gate structures and conductive interconnects are not shown for the sake of clarity and are well known to those of ordinary skill in the art.

Figure 2A:
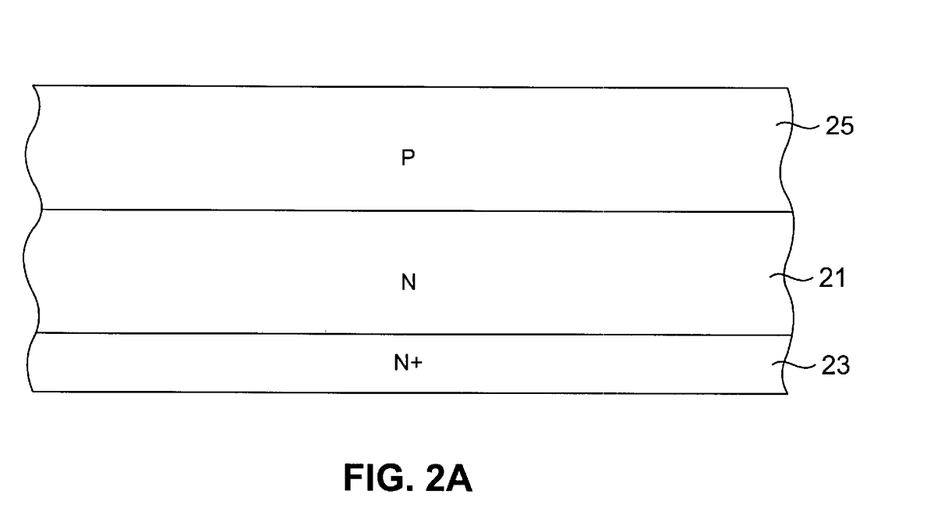
FIGS. 2A–2G are schematic cross-sectional views illustrating a sequence of processing steps for forming a DMOS transistor in accordance with the present invention

FIGS. 2A–2G shows a first embodiment of the method of the present invention that may be used to form a DMOS device of the type depicted in FIG. 1. In FIG. 2A, an N-doped epitaxial layer 21 is grown on a conventionally N+ doped substrate 23. The epitaxial layer is typically 5.5 microns in thickness for a 30 V device. Next, P-body region 25 is formed in an implantation and diffusion step. Since the P-body implant is uniform across the substrate, no mask is needed. The P-body regions are boron implanted at 40 to 60 KEV with a dosage of $5.5 \times 10^{13}/\text{cm}^3$.

Figure 2B:
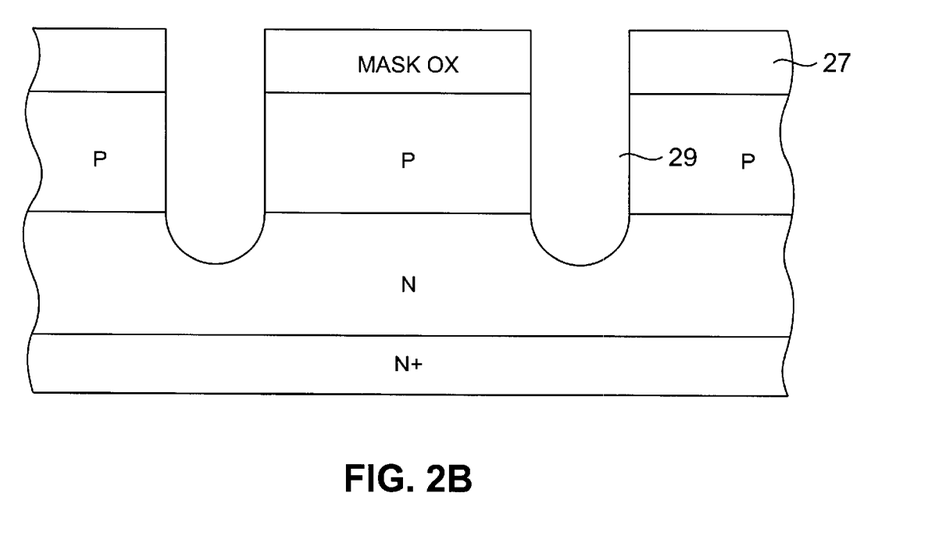

In FIG. 2B, a mask oxide layer is formed by covering the surface of the epitaxial layer with an oxide layer, which is then conventionally exposed and patterned to leave mask portions 27. Mask portions 27 are used for defining the location of the trenches 29, which are dry etched through the mask openings by reactive ion etching to a depth that typically ranges from 1.5 to 2.5 microns.

Figure 2C:
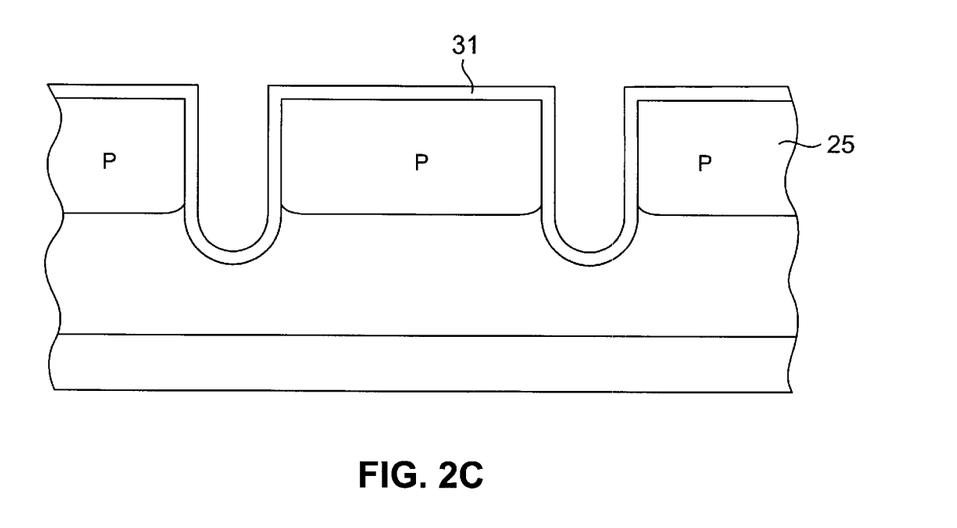

In FIG. 2C, the mask portions are removed, typically by a buffer oxide etch or an HF etch. Since the steps of trench formation are completed prior to removal of the patterned trench mask, and since the patterned trench mask serves as a cap or buffer during the trench forming process, dopant material does not leach out of the P-body. This is in contrast to previously mentioned U.S. Pat. No. 5,072,266, in which the trench mask is removed before performing the sacrificial oxide step, thus allowing dopant material to leach out of the p-body. By preventing dopant material from leaching out of the P-body, the methodology of the present invention reduces punch-through.

After removal of the mask portions, a gate oxide layer 31 is deposited on the entire structure so that it covers the trench walls and the surface of p-body 25. Gate oxide layer 31 typically has a thickness in the range of 500–800 angstroms.

Figure 2D:
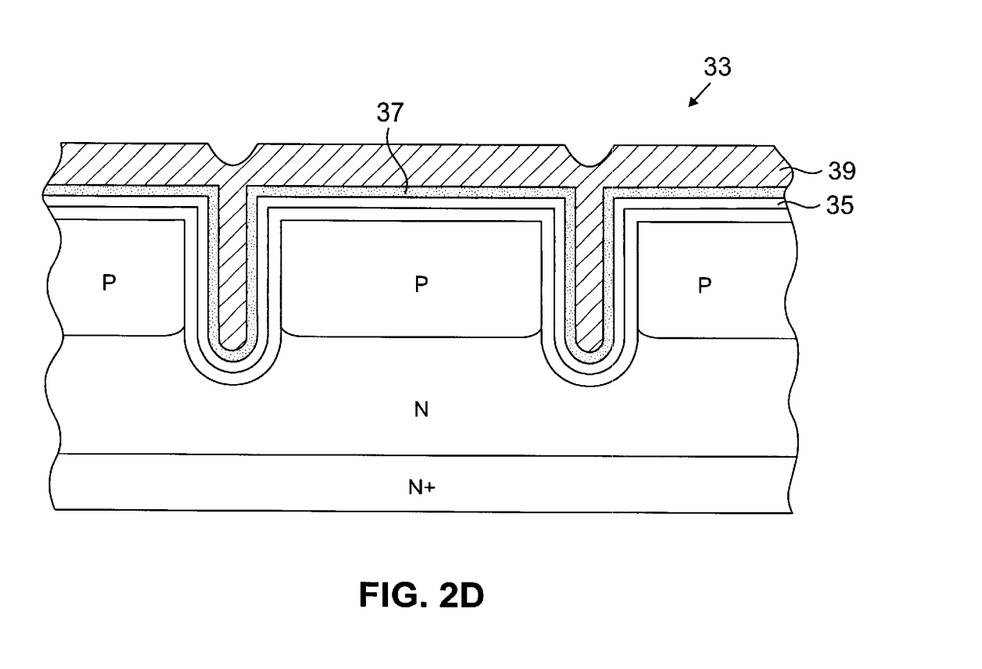

In FIG. 2D, after deposition of the gate oxide layer, a layer of undoped polysilicon 35 is deposited, followed by a layer of doped polysilicon 37, i.e., polycrystalline silicon doped with phosphorous chloride or implanted with arsenic or phosphorous to reduce its resistivity, which resistivity is typically within the range of 20 ohm. The undoped polysilicon layer acts as a buffer layer to block phosphorous penetration through the gate oxide layer during BPSG flow, thereby preventing drain/source punch-through. Next, a layer of polycide 39 such as $WSi_2$ or $TiSi_2$ or a layer of a refractory metal such as TiW or W is deposited.

Figure 2E:
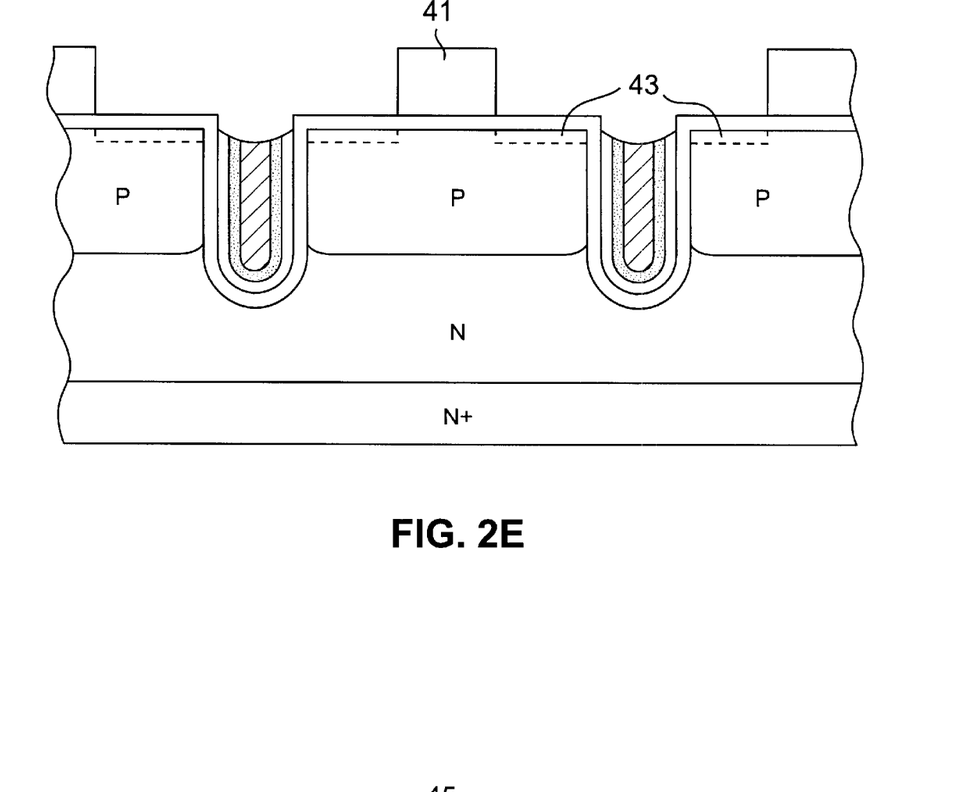
Figure 2F:
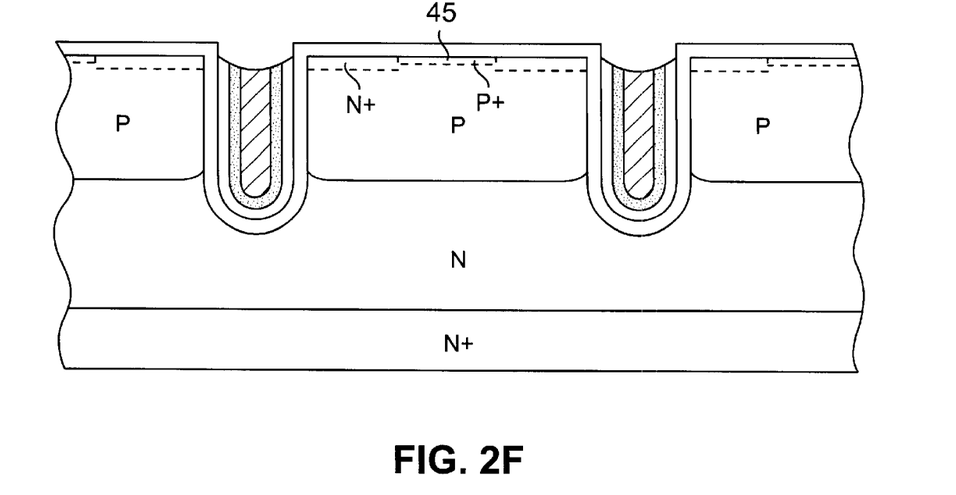
Figure 2G:
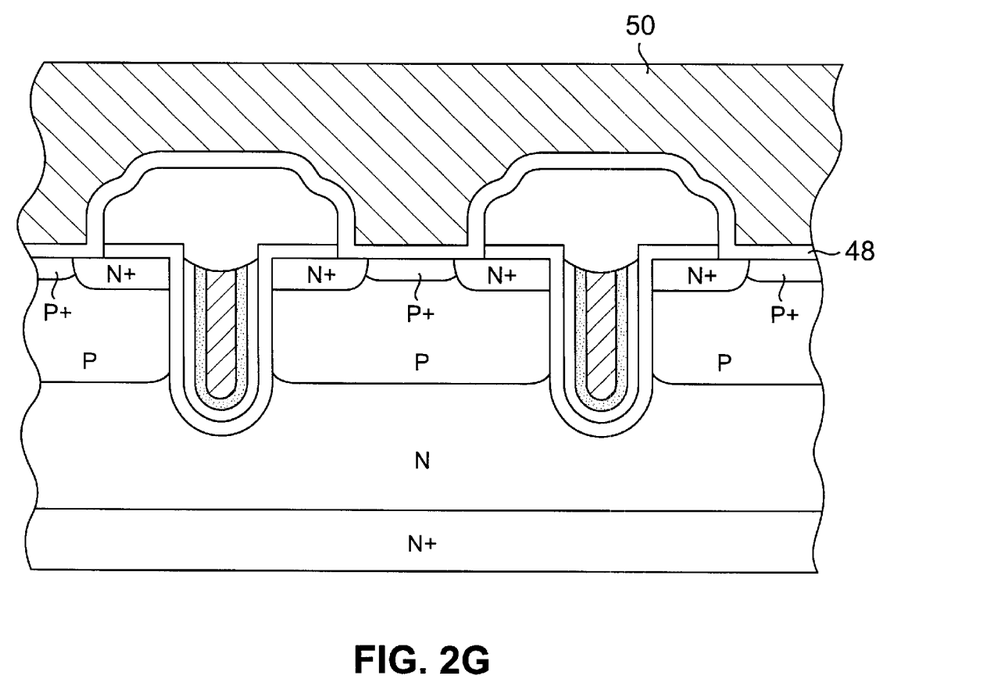

In FIG. 2E, the undoped poly, doped poly, and polycide layers are etched to expose the portion of the gate oxide layer that extends over the surface of the P-body. Next, a photoresist masking process is used to form a patterned masking layer 41. The patterned masking layer defines the N-source regions 43, which are subsequently formed by an implantation and diffusion process using arsenic or phosphorous. For example, the first source regions may be implanted with arsenic at 80 KEV to a concentration that is typically within the range of $8 \times 10^{15}$ to $1.2 \times 10^{16}/cm^3$. After implantation, the arsenic is diffused to a depth of approximately 0.5 microns. After formation of the N-source regions, the masking layer is removed in a conventional manner to form the structure depicted in FIG. 2F, and one or more P-source regions 45 are implanted The trench DMOS transistor is completed by forming and patterning a BPSG layer over the structure to define BPSG regions associated with the gate electrodes. The BPSG are patterned through a contact mask and etching process, after which successive layers of Ti/TiN 48 and AUSi/Cu 50 are deposited through a metal mask and etching process. Also, a drain contact layer is formed on the bottom surface of the substrate. Finally, a pad mask is used to define pad contacts.

Figure 3A:
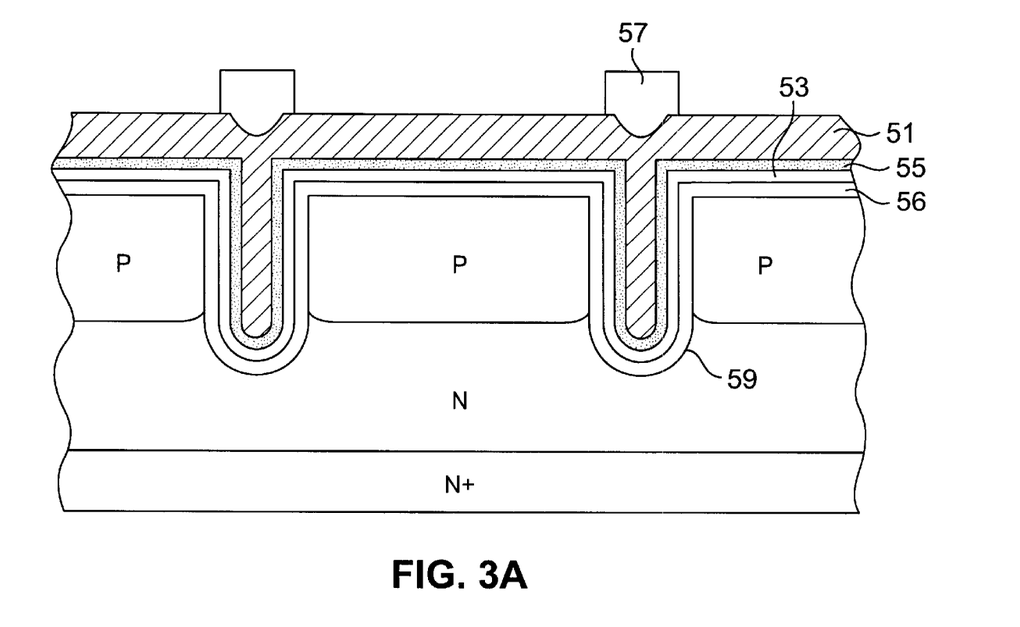
FIGS. 3A–3B are schematic cross-sectional views illustrating a sequence of processing steps for forming a DMOS transistor in accordance with the present invention.
Figure 3B:
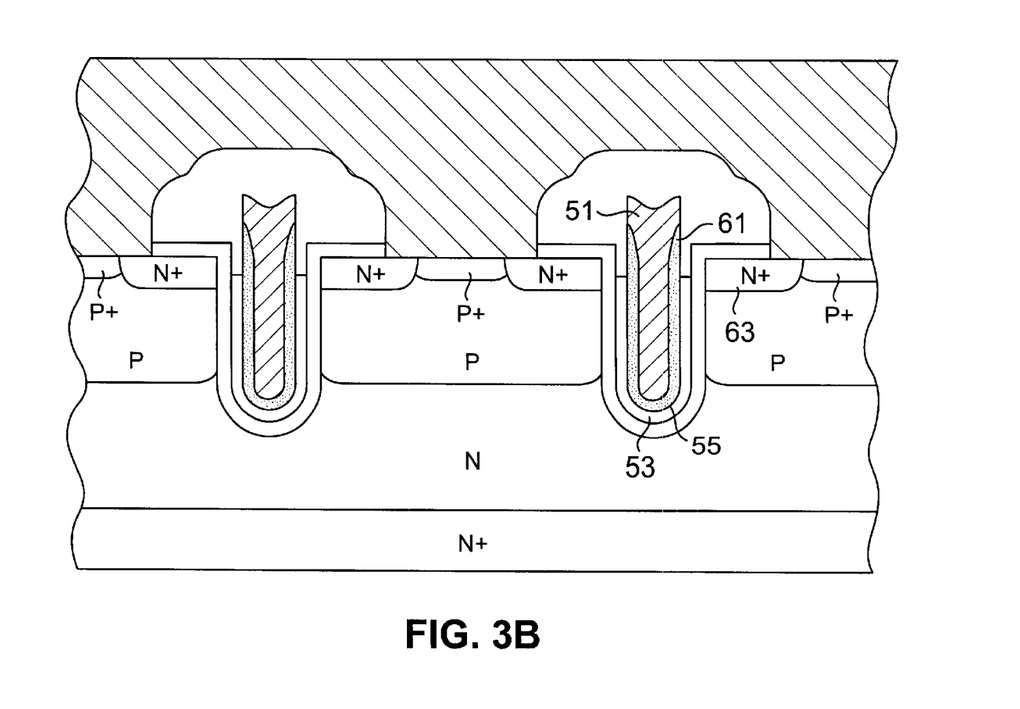

FIGS. 3A–3B illustrate a second embodiment of the method of the present invention. In this embodiment, a trench DMOS is formed substantially in accordance with the steps illustrated in FIGS. 2A–2D. However, after the deposition of the layer of polycide or refractory metal 51 over the layers of undoped polysilicon 53, doped polysilicon 55, and gate oxide 56, a polysilicon mask 57 is placed over the trench 59, and the resulting structure is subjected to etching to remove the unmasked polysilicon and polycide layers. The trench DMOS transistor is then completed in a manner similar to that depicted in FIGS. 2E–2G to yield the device depicted in FIG. 3B. In the finished device, a portion 61 of the gate layer is disposed above the source area 63, so that the distance between the drain and the portion 61 of the gate layer is greater than the distance between the drain and the source. As a result, the configuration has a lower gate resistance, especially in a shallow trench device, thereby achieving higher switching speeds.

Figure 4A:
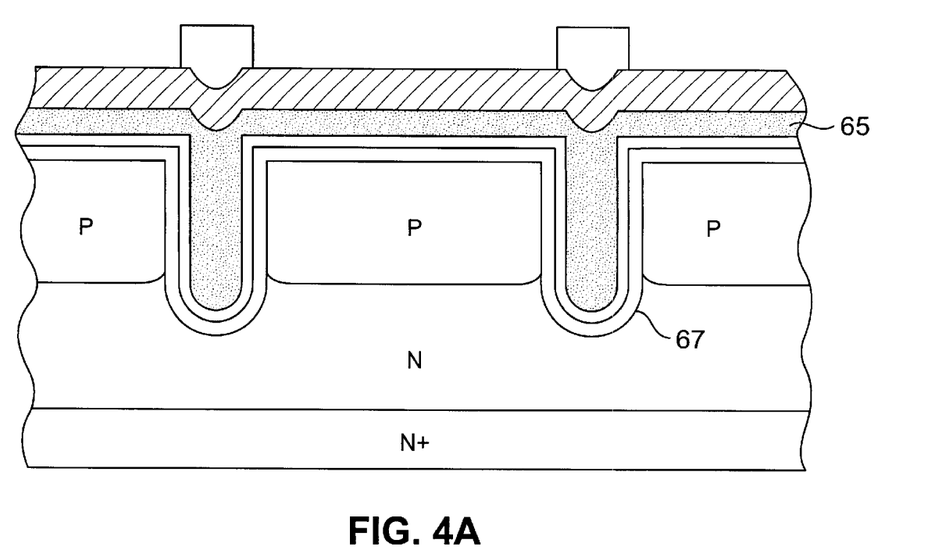
FIGS. 4A–4B are schematic cross-sectional views illustrating a sequence of process steps for forming a DMOS transistor in accordance with the present invention.
Figure 4B:
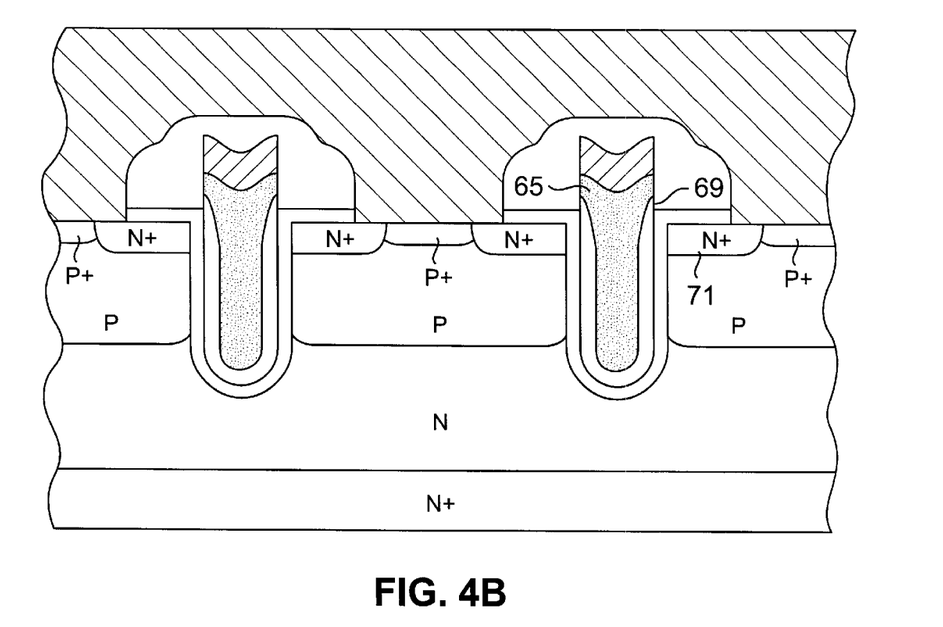

FIGS. 4A–4B illustrate a third embodiment of the method of the present invention. In this embodiment, the trench DMOS is formed in a manner similar to that used to form the devices depicted in FIGS. 3A–3B, except that the layer of doped polysilicon 65 employed is sufficiently thick to fill the trench 67. As in the device depicted in FIGS. 3A–3B, at least a portion 69 of the gate layer in the finished device is disposed above the source area 71 so that the distance between the drain and at least a portion of the gate layer is greater than the distance between the drain and the source. This configuration, like the configuration depicted in FIGS. 3A–3B, also has a lower gate resistance, especially in a shallow trench device, and higher switching speeds.

In accordance with the methodology of the present invention, the N-source region is formed after gate oxidation so that the junction depth can be controlled to very shallow depths (e.g., within the range of 0.2 to 0.5 $\mu$m), depending on the BPSG flow temperature cycle which will typically range from 900 to 950° C. The parasitic capacitance is thus reduced, because shallower P-body and trench depths are achievable without having drain/source punch through. Moreover, less stress or void formation results between the polysilicon and polycide or refractory metal, since no high temperature process is performed after CVD polycide or refractory metal deposition.

In the various embodiments of the present invention, punch-through may also be reduced by filling the trench with polysilicon in a two step process. In the first step, a layer of undoped polysilicon is deposited over the gate oxide layer to line the sidewalls of the trenches. The undoped polysilicon layer is followed by the deposition of a layer of doped polysilicon. Typically, the thickness of the doped polysilicon layer is greater than the thickness of the undoped polysilicon layer. For example, the ratio of the thickness of the doped polysilicon layer to the undoped polysilicon layer may be 7:1 or greater, with a typical total thickness of about 8,000 A.

The undoped polysilicon layer may be advantageously employed as a buffer layer to inhibit the penetration of dopant material through the gate oxide layer and into the P-body, thus further reducing punch-through. This two step process may be used when the trench is formed prior to the removal of the trench mask. Alternatively, the two layer deposition process may be used by itself to reduce punch through. That is, the trench may be filled with undoped and doped layers of polysilicon even when the trench mask is removed before the formation of the trench.

Although various embodiments are specifically illustrated and described herein, it will be appreciated that modifications and variations of the present Invention are covered by the above teachings and are within the purview of the appended claims without departing from the spirit and intended scope of the invention. For example, the method of the present invention may be used to form a trench DMOS in which the conductivities of the various semiconductor regions are reversed from those described herein.

What is claimed is:

1. A method for forming a trench DMOS, comprising the steps of:

providing an article comprising a substrate of a first conductivity type and a body region of a second conductivity type, said article having a trench which extends through said body region and said substrate;

depositing a gate oxide layer in the trench;

forming a gate in the trench, said gate having at least one layer comprising a material selected from the group consisting of polycide and refractory metals; and forming a source region in the body region; wherein the source region is formed after the gate oxide layer is deposited.

2. The method of claim 1, wherein said gate comprises a first layer comprising undoped polysilicon, a second layer comprising doped polysilicon, and a third layer comprising a material selected from the group consisting of polycide and refractory metals.

3. The method of claim 2, wherein said first layer is adjacent to said gate oxide layer.

4. The method of claim 1, wherein said gate has at least one layer comprising a refractory metal.

5. The method of claim 4, wherein said refractory metal is selected from the group consisting of W and TiW.

6. The method of claim 1, wherein said gate has at least one layer comprising polycide.

7. The method of claim 6, wherein said polycide is selected from the group consisting of $WSi_2$ and $TiSi_2$.

8. The method of claim 1, wherein said trench is formed by providing a masking layer defining at least one trench, and forming the trench defined by the masking layer.

9. The method of claim 8, wherein said masking layer is disposed on said body region before said trench is formed.

10. The method of claim 8, wherein said mask is removed after said trench is formed.

11. The method of claim 1, wherein said body region is a P-body.

12. The method of claim 1, wherein said body region is formed by implanting and diffusing a dopant into the substrate.

13. The method of claim 1, wherein the body region is disposed on said substrate.

14. The method of claim 1, wherein the source region is a source region of said first conductivity type.

15. The method of claim 14, further comprising the step of forming a source region of a third conductivity type.

16. The method of claim 15, wherein the first conductivity type is n+ and the third conductivity type is p+.

17. The method of claim 1, wherein said source region is an n+ source region.

18. The method of claim 1, wherein said source region is adjacent to said trench.

19. The method of claim 1, wherein said source region is formed with a junction depth of less than about 0.5 μm.

20. The method of claim 1, wherein said source region is formed with a junction depth within the range of about 0.2 to about 0.5 μm.

21. The method of claim 1, further comprising the step of:

forming a patterned BPSG layer over said trench.

22. The method of claim 21, wherein the pattered BPSG layer is formed over the trench with a flow temperature cycle ranging from about 900 to about 950° C.

23. The method of claim 1, wherein the step of forming a gate in the trench includes the steps of filling the trench with polysilicon, and depositing on the polysilicon a layer comprising a material selected from the group consisting of polycide and refractory metals.

24. A method for making a trench DMOS, comprising the steps of:

providing a substrate of a first conductivity type;

forming a body region on the substrate, said body region having a second conductivity type;

forming a masking layer defining at least one trench;

forming the trench defined by the masking layer, said trench extending through the body region and the substrate;

forming a gate in the trench, said gate comprising a first layer comprising undoped polysilicon, a second layer comprising doped polysilicon, and a third layer comprising a material selected from the group consisting of polycide and refractory metals; and forming a first source region of the first conductivity type in the body region adjacent to the trench.

25. The method of claim 24, further comprising the step of:

forming a second source region of a third conductivity type adjacent to said first source region.

26. The method of claim wherein said first source region is an n+ source, and wherein said second source region is a p+ source.

27. The method of claim 24, wherein said trench is covered with an insulating layer before said gate is formed.

28. The method of claim 27, wherein said insulating layer is a gate oxide layer.

29. A method for forming a trench DMOS transistor cell, comprising the steps of:

providing an article comprising a substrate of a first conductivity type and a body region of a second conductivity type, said article having a trench which extends through said body region and said substrate;

forming a gate overlying said trench and said body region, said gate having at least one layer comprising a material selected from the group consisting of polycide and refractory metals;

placing a mask over the trench;

removing the unmasked portions of the gate; and forming a first source region in the body region.

30. The method of claim 29, wherein the trench and body region are lined with an insulating layer prior to formation of the gate.

31. The method of claim 29, wherein the first source region is of the first conductivity type.

32. The method of claim 29, wherein the first source region is adjacent to the trench.

33. The method of claim 29, further comprising the step of:

forming a second source region of a third conductivity type.

34. The method of claim 29, wherein the first source region is an n+ source region.

35. The method of claim 33, wherein the first source region is an n+ source region, and wherein the second source region is a p+ source region.

36. The method of claim 29, wherein the step of forming the gate includes the steps of filling the trench with polysilicon, and depositing on the polysilicon a layer comprising a material selected from the group consisting of polycide and refractory metals.

* * * * *